US006986198B2

(12) United States Patent
Fallon et al.

(10) Patent No.: US 6,986,198 B2
(45) Date of Patent: Jan. 17, 2006

(54) METHOD OF FORMING PRINTED CIRCUIT CARD

(75) Inventors: Kenneth Fallon, Rochester, NY (US); Miguel A. Jimarez, Newark Valley, NY (US); Ross W. Keesler, Endicott, NY (US); John M. Lauffer, Waverly, NY (US); Roy H. Magnuson, Endicott, NY (US); Voya R. Markovich, Endwell, NY (US); Irv Memis, Vestal, NY (US); Jim P. Paoletti, Endwell, NY (US); Marybeth Perrino, Apalachin, NY (US); John A. Welsh, Binghamton, NY (US); William E. Wilson, Waverly, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/744,142

(22) Filed: Dec. 22, 2003

(65) Prior Publication Data

US 2004/0134685 A1   Jul. 15, 2004

Related U.S. Application Data

(60) Division of application No. 09/690,485, filed on Oct. 17, 2000, now Pat. No. 6,750,405, which is a continuation of application No. 09/203,956, filed on Dec. 2, 1998, now Pat. No. 6,204,453, which is a continuation of application No. 08/774,849, filed on Dec. 27, 1996, now Pat. No. 5,876,842, which is a continuation of application No. 08/486,222, filed on Jun. 7, 1995, now abandoned.

(51) Int. Cl.
   *H05K 3/36*   (2006.01)

(52) U.S. Cl. ............... 29/830; 29/831; 29/846; 29/852; 174/262; 430/311

(58) Field of Classification Search .......... 29/830–834, 29/852, 846–847; 174/261–266, 255, 252; 361/748, 765, 719–720; 430/280.1, 311, 430/313
See application file for complete search history.

(56) References Cited

U.S. PATENT DOCUMENTS

| 4,830,704 | A | 5/1989 | Voss et al. |
| 5,021,821 | A | 6/1991 | Suzuki |
| 5,026,624 | A | 6/1991 | Day et al. |
| 5,146,674 | A | 9/1992 | Frankeny et al. |
| 5,262,280 | A | 11/1993 | Knudsen et al. |
| 5,298,117 | A | 3/1994 | Hanson et al. |
| 5,300,402 | A | 4/1994 | Card, Jr. et al. |

(Continued)

*Primary Examiner*—Minh Trinh
(74) *Attorney, Agent, or Firm*—William N. Hogg

(57) ABSTRACT

A method of forming a printed circuit card with a metal power plane layer between two photoimageable dielectric layers is provided. Photoformed metal filled vias plated through holes are in the photopatternable material, and signal circuitry is on the surfaces of each of the dielectric materials connected to the vias and plated through holes. A border may be around the card including a metal layer termination in from the edge of one of the dielectric layers. Copper foil with clearance holes is provided. First and second layers of photoimageable curable dielectric material are on opposite sides of the copper. Patterns are developed on the first and second layers of the photoimageable material to reveal the metal layer through vias. Through holes are developed where holes were patterned in both dielectric layers. The surfaces of the photoimageable material, vias and through holes are metallized by copper plating, preferably using photoresist.

6 Claims, 3 Drawing Sheets

U.S. PATENT DOCUMENTS

| | | |
|---|---|---|
| 5,334,487 A | 8/1994 | Kindl et al. |
| 5,366,846 A | 11/1994 | Knudsen et al. |
| 5,822,856 A * | 10/1998 | Bhatt et al. ............... 29/832 |
| 5,876,842 A * | 3/1999 | Duffy et al. ............... 428/209 |
| 6,204,453 B1 * | 3/2001 | Fallon et al. ............... 174/255 |
| 6,370,766 B1 * | 4/2002 | Degani et al. ............... 29/832 |
| 6,451,509 B2 * | 9/2002 | Keesler et al. ............... 430/311 |
| 6,608,757 B1 * | 8/2003 | Bhatt et al. ............... 361/748 |
| 6,750,405 B1 * | 6/2004 | Fallon et al. ............... 174/262 |
| 6,820,332 B2 * | 11/2004 | Japp et al. ............... 29/852 |

\* cited by examiner

METHOD OF FORMING PRINTED CIRCUIT CARD

CROSS REFERENCE TO RELATED APPLICATIONS

This application is a division of patent application Ser. No. 09/690,485 filed Oct. 17, 2000, which is U.S. Pat. No. 6,750,405 which is a continuation of application Ser. No. 09/203,956 filed Dec. 2, 1998, which is U.S. Pat. No. 6,204,453 B1, which, in turn, is a continuation-in-part of application Ser. No. 08/774,849 filed Dec. 27, 1996, which is U.S. Pat. No. 5,876,842, which is a continuation of application Ser. No. 08/486,822 filed Jun. 7, 1995, now abandoned.

BACKGROUND OF THE INVENTION

This invention relates generally to the formation of circuit boards or cards or the like, and more particularly to the formation of circuit boards or cards having two signal planes and one power plane (2S/1P) wherein the power plane is sandwiched between two layers of photopatternable dielectric material and on which layers of circuitry for the signal planes are disposed.

BACKGROUND INFORMATION

In certain conventional circuit board configurations, the circuit board cross-section includes non-photopatternable dielectric, such as FR4 which is epoxy impregnated fiberglass, and one or more layers of copper. Vias and plated through holes are mechanically or laser drilled in the dielectric material. This requires precise alignment drilling with each hole being drilled definitely and sequentially. Moreover, in some instances, it is necessary that there be an isolation border around the edge of the card or board to prevent the power plane from being exposed at the edge. Isolation borders are also created within a card or board to allow separate voltage areas on the same plane. Isolation borders are created by etching away the copper, which exposes the FR4 material therebelow. The exposed FR4 material isolates two adjacent areas of copper, which by design should not be in contact with each other. The isolation border is also used around the edge of the board to prevent exposed copper on the edges from abutting together in the card or board profile operation. The same technique is used to display text on the board, such as part numbers, etc.

While photoimageable material has been used on one side of a metal substrate, various processing difficulties are encountered when using photoimageable material to form a 2S/1P board, with the photoimageable material on both sides of the metal power plane. In a process that sandwiches a preformed metal power plane with photoimageable dielectric polymers as the dielectric material on which circuit traces are to be formed, isolation borders cannot be formed in the same way as with the non-photopatternable FR4. If the same process were used after the copper is etched away, the parts of the panel would be isolated and would literally fall apart since there is no remaining material to hold them together.

It is, therefore, a principal object of the present invention to provide a process in which layers of photoimageable dielectric material are used on opposite sides of a metal layer forming a power plane on which circuit traces are formed and in which vias and plated through holes are formed. In one aspect, a technique is provided wherein an isolation border can be formed in the power plane without the panel falling apart.

SUMMARY OF THE INVENTION

According to the present invention, a method of forming a printed circuit board or circuit card is provided wherein there is metal layer which serves as a power plane sandwiched between a pair of photoimageable dielectric layers, and wherein photoformed metal filled vias and photoformed plated through holes are formed in the photopatternable material, and signal circuitry is formed on the surfaces of each of the dielectric materials and connected to the vias and plated through holes. In one embodiment, a border around the board or card is provided wherein said metal layer terminates a distance spaced from the edge of one of the dielectric layers.

A border can also be used within a card or board to isolate separate voltages on the same plane. The method includes the steps of providing a layer of metal, preferably copper foil, with clearance holes. A first layer of photoimageable dielectric curable material is disposed on one side of the foil, and a second layer of photoimageable curable dielectric material is disposed on the other side of said layer of material. Preferably, the photoimageable dielectric material is an epoxy-based resin.

Both the first and second layers of the curable photoimageable material are photopatterned in a pre-selected pattern on each side. (If a border is to be formed, the first layer of photoimageable material includes a border pattern, and the pattern on the second layer of photoimageable material does not include the border pattern.) The patterns are developed on the first and second layers of the photoimageable material to reveal the metal layer through vias and, in the case of a border, to reveal the metal at the border in the developed patterns. At the clearance holes in the metal layer, through holes have been developed where holes were patterned in both dielectric layers. Thereafter, the surface of each of the photoimageable material, vias and through holes is metallized by the use of photolithographic techniques and preferably through additive copper plating. If a border is present, the metal surrounding the borders revealed through the first layer is etched to thereby provide a substrate which has an edge defined by the second layer of photoimageable material extending beyond the edge of the metal layer. This etching is preferably done by protecting the remainder of the circuitry by the use of photoresist and utilizing photolithographic techniques. When such technique is used, the photoresist is thereafter removed, thereby leaving a circuit board or card having metallization on both sides, vias extending from both sides to the metal layer in the center, plated through holes connecting the two outer circuitized metal layers, and in the case of forming a board with the metal removed to form a border supported by one of the patternable dielectric materials which remain undeveloped.

DESCRIPTION OF THE PREFERRED EMBODIMENT

Figure 1:
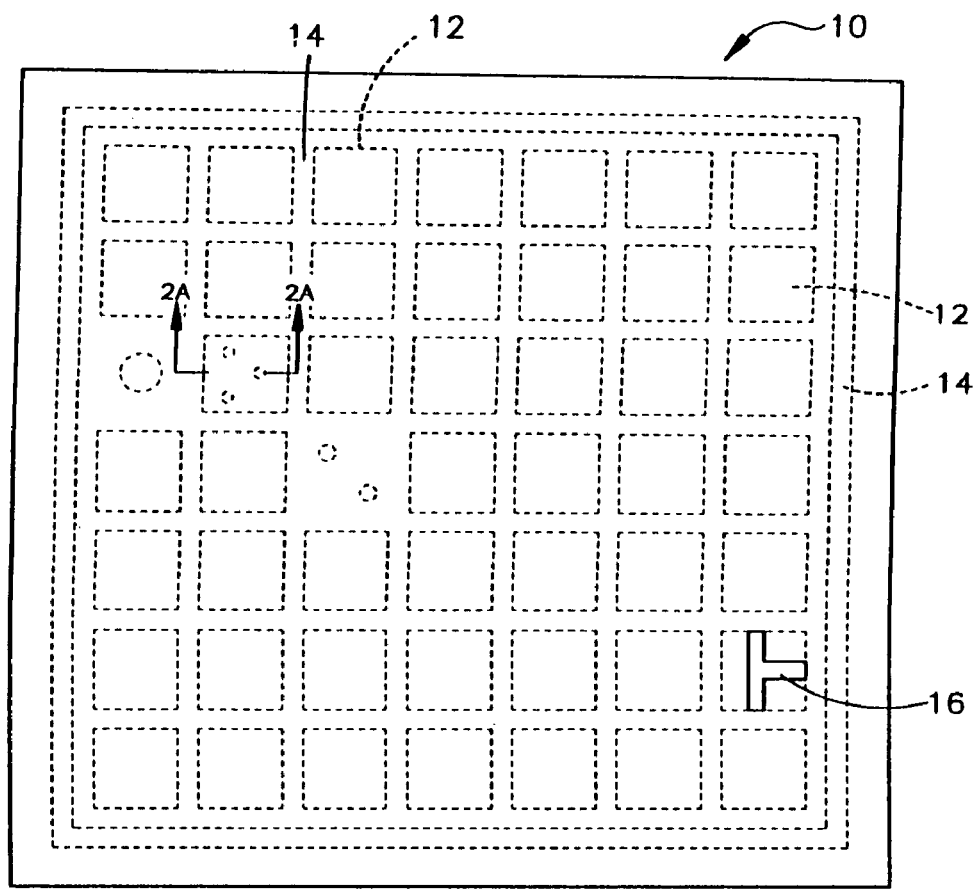
FIG. 1 is a plan view, somewhat schematic, showing the various cards or boards formed on a panel during processing.

Referring now to the drawings, FIG. 1 shows a very schematic representation of a panel used to form a plurality of circuit cards or boards thereon when the cards, boards or sections of cards or boards are required to be electrically separated, i.e., there can be no physical contact in the power plane between the various cards or boards being formed. As shown in FIG. 1, panel 10 has a plurality of circuit cards designated by the reference character 12 formed thereon, and the various cards 12 are separated by borders 14 which extend completely around each of the cards 12. Borders 16 are borders that provide an electrical separation within a card. The term "cards" or "circuit cards" is used herein to designate circuitized substrates which can be used as chip carriers, or circuit boards for the mounting of components as well as chips. The formation of the cards 12 is shown in the various stages thereof in FIGS. 2A–2k starting with a metal layer which will form the power plane and progressing through the various steps to form a final circuitized card or board with a border therearound free of the metal which forms the power plane.

Figure 2A:
FIGS. 2a–2k are sectional views taken substantially along the plane designated by the line 2A—2A of FIG. 1, showing the formation of a circuit board in its various stages of manufacturing.

Referring now to FIG. 2A, a metal layer 20 is shown which in one preferred embodiment is copper in the form of a 1-oz. copper foil, although other sizes of copper foil could be used; e.g., ½-oz. copper foil. However, one ounce copper foil is one standard material conventionally used for a power plane. It is contemplated that the metal layer should be from about 0.7 mil to about 2.8 mils thick. Formation will be described in forming a circuit card which has a 1P/2S configuration, i.e., one power plane and two signal planes.

In many instances, plated through holes are required which extend from the circuitry on the exposed surface of one layer of dielectric to the circuitry on the exposed surface of the other dielectric material. In such a case, through holes, one of which is shown at 22, are formed in the copper foil 20. These can be formed either by mechanical drilling or by etching. One technique for etching is by the use of a photolithographic process wherein the location of each of the holes is patterned and developed in photoresist which is coated onto both surfaces of the copper, and the holes etched through the copper by an etchant such as cupric chloride ($CuCl_2$). The photoresist is then stripped. This process is well known in the art.

Figure 2B:
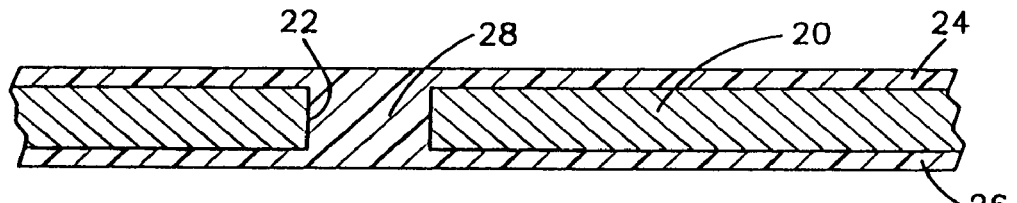

A first layer of photoimageable dielectric material 24 is coated onto one side of the copper foil 20, a second layer of a photoimageable dielectric material 26 is coated on the opposite side of the copper foil 20, and the dielectric material fills in the through hole 22 as shown at 28. Each layer of dielectric material is preferably between 2 mils and 4 mils thick. A particularly useful photoimageable material is an epoxy-based material of the type described in U.S. Pat. No. 5,026,624, entitled "Composition for Photoimaging", commonly assigned, which is incorporated herein by reference. As shown in FIG. 2B, this material is photoimaged or photopatterned, developed to reveal the desired pattern, and thereafter cured to provide a dielectric substrate on which metal circuit traces, such as plated copper, can be formed for forming the circuit board. The dielectric material may be curtain coated as described in said U.S. Pat. No. 5,026,624, or it can contain a thixotrope and be screen applied as described in U.S. Pat. No. 5,300,402. The material may also be applied as a dry film. A technique for forming a dry film is as follows:

The photoimageable dielectric composition is prepared having a solids content of from about 86.5% to 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% Fc 430, a fluorinated polyether nonionic surfactant from 3M Company; 3.8% Aerosil 380, an amorphous silicon dioxide from Degussa; to provide the solid content. Solvent was present from about 11% to 13.5% of the total photoimageable dielectric composition. The photoimageable dielectric composition is coated onto a 1.42 mil thick segment of polyethylene terephthalate designated Mylar D, a segment of polyethylene terephthalate designated Mylar D, a polyester layer from DuPont. The photoimageable dielectric composition is allowed to dry to provide a 2.8 mil thick photoimageable dielectric film on the polyethylene terephthalate backing.

Figure 2C:
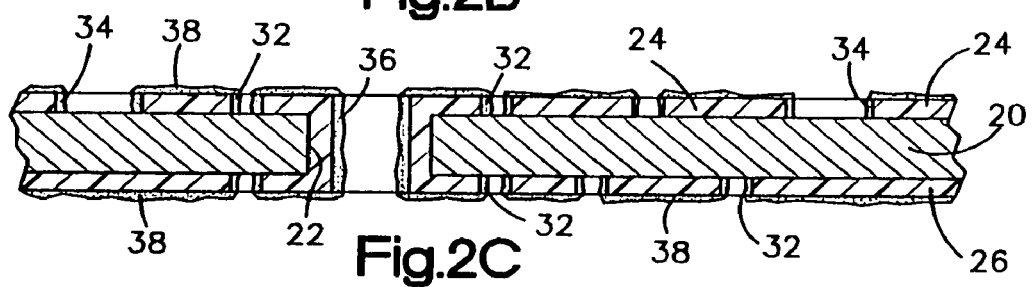

The particular material 24 and 26 as described in said U.S. Pat. Nos. 5,026,624 and No. 5,300,402 is negative acting photodielectric. Hence, those areas which are exposed to actinic radiation, in this case UV light, will not be developed (i.e., will remain) when the material is developed in developer, and areas which are not exposed will be removed, i.e., developed out. Masks are applied over both the photoresist 24 and 26 having those areas which are to be developed blanked out, and the remainder of the dielectric material 24 and 26 exposed to UV light. The preferred agent for developing this material is propylene carbonate. As shown in FIG. 2C, this will provide openings 32 which extend to the surface of the copper foil 20 and openings 34 on the photoresist 24 which will reveal the foil 20 thereunder which will form the border, and openings 36 which are smaller in diameter than the openings 32 in the copper foil 20, which will thus allow for a plated through hole. Following the development, the remaining dielectric material 24 and 26 is given a UV bump and then cured at between 150° C. and 190° C. as described in said U.S. Pat. No. 5,026,624. The developing and curing is described in detail in said U.S. Pat. No. 5,026,624. The dielectric material can be sufficiently toughened to form a base on which electrical circuitry can be deposited or formed. Following this, the entire surface is treated by vaporous blasting and optional desmearing, and then seeded for copper plating, preferably with palladium 38, so as to provide for electroless copper plating as is well known in the art. This stage of manufacture is shown in FIG. 2C.

Figure 2D:
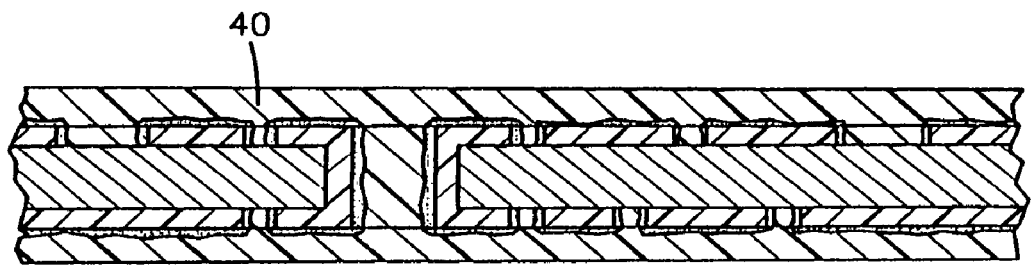
Figure 2E:
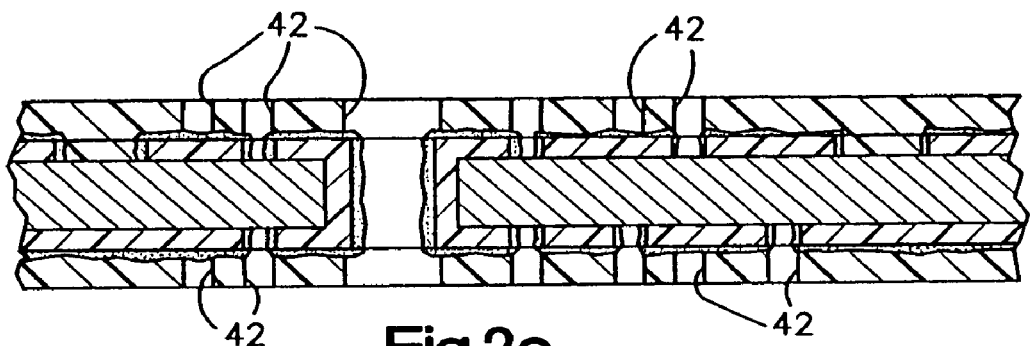

Both sides of the product at this point are coated with photoresist 40, as shown in FIG. 2d; preferably the resist is DuPont Resiston T168, which is a negative acting photoresist. The photoresist is then exposed everywhere except where copper plating is to take place and is developed. The resist is preferably developed with propylene carbonate as is well known and will form openings 42 through the photoresist 40 at places where the copper plating is to take place. The openings will be located above the layers 24 and 26 where circuit traces are to be formed, where vias are to be formed and where plated through holes are to be formed. This stage of manufacture is shown in FIG. 2e.

Figure 2F:
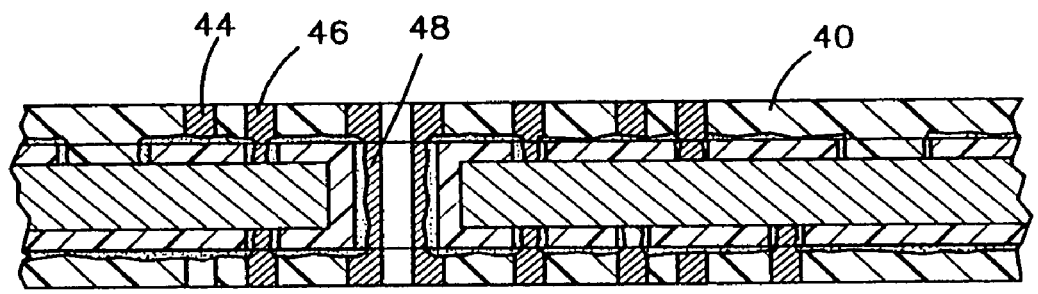

Following this, copper is electrolessly plated according to well-known techniques onto the exposed areas through the openings 42 in the photoresist 40 as shown in FIG. 2f to form circuit tracers 44 on dielectric material 24 and 26, and blind vias 46 extending through dielectric material 24 and 26 in contact with copper layer 10 and plated through holes 48. Following this, optionally the surfaces can be planarized, although this is often not required.

Figure 2G:
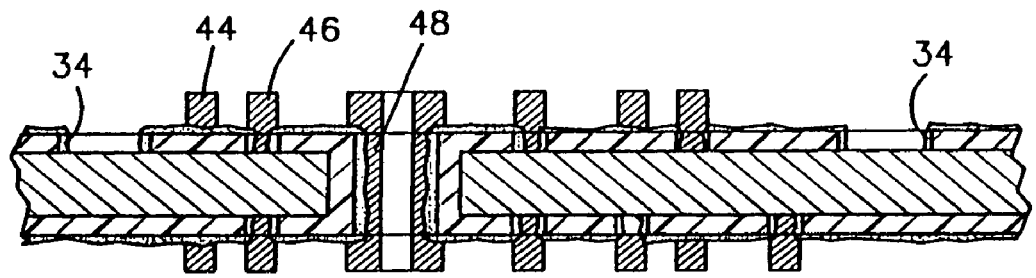

Following the electroless plating, the photoresist 40 is stripped as shown in FIG. 2g by propylene carbonate at elevated temperatures so as to provide circuitry 44, vias 46 and plated through holes 48. Developing of the photoresist also reveals the copper 20 beneath the photoresist 24 in openings 34 therein. The copper 20 is not revealed on the opposite side through photoresist 26. At this stage, the remaining palladium seed 38 on which plating has not occurred is stripped, preferably in a cyanide bath.

Figure 2H:
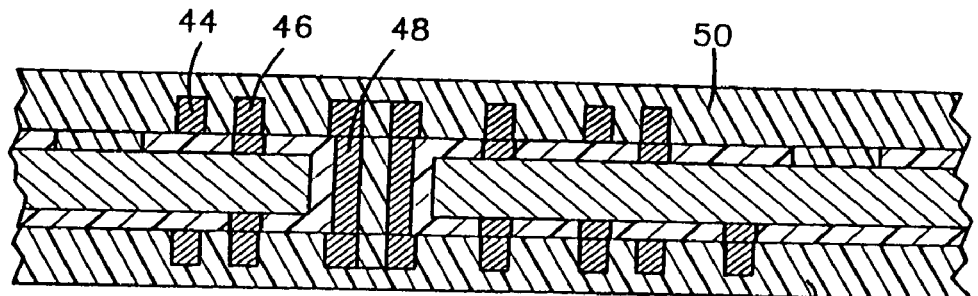
Figure 2I:
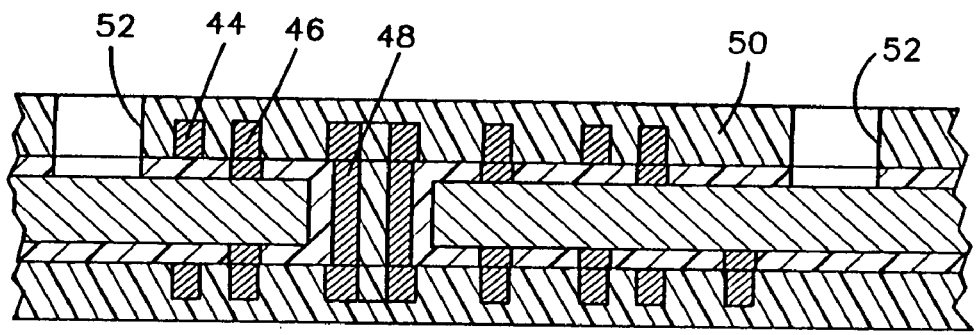

Following the stripping of the palladium seed, another coating of photoresist 50 is applied to both sides of the part shown in FIG. 2h. Preferably, this photoresist is negative acting MI photoresist sold by the MacDermid Company. The photoresist 50 overlying the photopatternable material 24 is exposed everywhere, except at the opening 34, and developed to provide an opening 52 communicating with the opening 34. This can be developed by the use of sodium carbonate. This is shown in FIG. 2i.

Figure 2J:
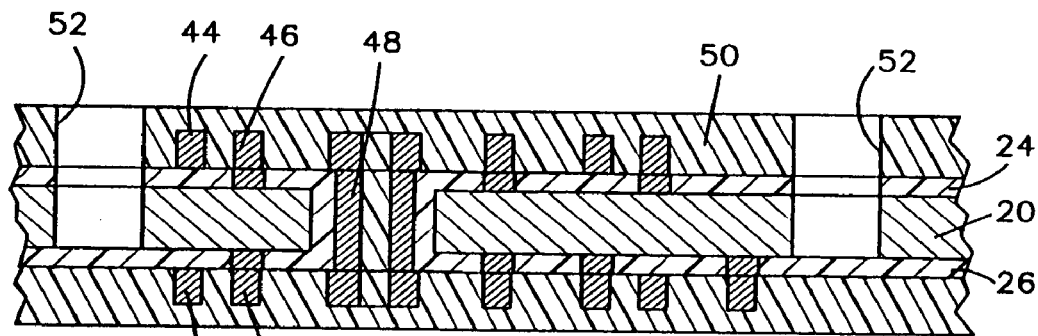
Figure 2K:
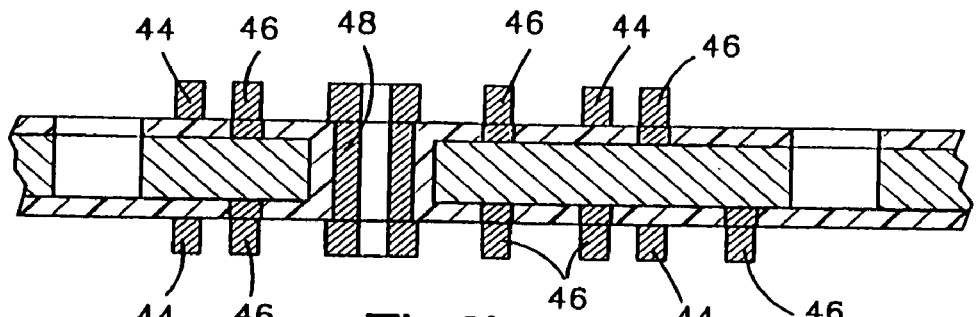

The copper revealed under the opening 34 is then etched, preferably using a cupric chloride solution which will provide the part as shown in FIG. 2j. The remainder of the photoresist 50 is then stripped with NaOH, which will result in the part shown in FIG. 2k. As can be seen, the copper foil 20 terminates at the outer edge of the photopatternable material 24, whereas the outer edge of the photopatternable material 26 extends beyond the copper 24. Thus, referring again to FIG. 1, the entire panel is held together by the bottom photopatternable material 26, even though a border has been created in the top photopatternable material 24 and in the copper 20 therearound, thus preserving the integrity of the entire panel 10.

If a border is not required, i.e. if the Cu sheet 20 can be maintained as a unit and extended up to the edge of the board, the steps in the process described above relating to forming the border can be omitted. Thus, the opening 34 is not formed, and the photopatterning and plating will take place as shown in FIGS. 2C through 2g which will represent the final product, since the steps shown in FIGS. 2h through 2k are unnecessary.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of forming a printed circuit card comprising the steps of:
   providing a layer of metal having opposite sides,
   forming at least one opening through said layer of metal,
   providing first and second layers of photoimageable material on opposite sides of said layer of metal,
   photopatterning and developing said first and second layers of said photoimageable meterial to form an opening extending through both layers of said photoimageable material and said at least one opening in said metal layer and which openings in said photoimageable layers are smaller than the opening in said layer of metal, forming at least one via in at least one layer of photoimageable material that terminates at said layer of metal, circuitizing the exposed surface of each of said layers of photoimageable material with circuitry and depositing metal in said at least one hole in said photoimageable material and in said at least one via.

2. The invention as defined in claim 1 wherein said phtoimageable material is deposited as a dry film.

3. The invention as defined in claim 1 wherein said circuitry is formed by additive plating.

4. The method of claim 1 further characterized by connecting the circuitry to the metal in the via.

5. The invention as defined in claim 1 further characterized by a plated through hole extending each layer of dielectric material and through the metal layer.

6. The invention as defined in claim 5 wherein said plated through holes is electrically connected to the circuitry on both dielectric materials.

* * * * *

UNITED STATES PATENT AND TRADEMARK OFFICE
CERTIFICATE OF CORRECTION

PATENT NO. : 6,986,198 B2
DATED : January 17, 2006
INVENTOR(S) : Fallon et al.

It is certified that error appears in the above-identified patent and that said Letters Patent is hereby corrected as shown below:

Column 6,
Line 33, after "extending" insert -- through --.

Signed and Sealed this

Twenty-eighth Day of March, 2006

JON W. DUDAS
*Director of the United States Patent and Trademark Office*